US012261066B2

(12) United States Patent
Nogami et al.

(10) Patent No.: US 12,261,066 B2
(45) Date of Patent: Mar. 25, 2025

(54) SUBSTRATE PROCESSING APPARATUS AND FURNACE OPENING CLOSER (71) Applicant: KOKUSAI ELECTRIC CORPORATION, Tokyo (JP)

(72) Inventors: Takashi Nogami, Toyama (JP); Norihiro Yamashima, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 587 days.

(21) Appl. No.: 17/376,446

(22) Filed: Jul. 15, 2021

(65) Prior Publication Data
US 2021/0343562 A1 Nov. 4, 2021

Related U.S. Application Data (63) Continuation of application No. PCT/JP2020/006416, filed on Feb. 19, 2020.

(30) Foreign Application Priority Data

Feb. 20, 2019 (JP) .................... 2019-028224

(51) Int. Cl.
*H01L 21/673* (2006.01)
*H01L 21/67* (2006.01)
*H01L 21/677* (2006.01)

(52) U.S. Cl.
CPC .. *H01L 21/67303* (2013.01); *H01L 21/67098* (2013.01); *H01L 21/67757* (2013.01)

(58) Field of Classification Search
CPC ......... H01L 21/67303; H01L 21/67098; H01L 21/677757
See application file for complete search history.

(56) References Cited

U.S. PATENT DOCUMENTS 5,193,998 A * 3/1993 Hack .................... C21D 9/0006
110/173 R
6,419,482 B1 * 7/2002 Sakata .............. H01L 21/67772
49/464
(Continued)

FOREIGN PATENT DOCUMENTS

JP H9-237782 A 9/1997
JP 2002-009008 A 1/2002
(Continued)

OTHER PUBLICATIONS

State Intellectual Property Office of the People's Republic of China, Office Action Issued on Apr. 20, 2024 for Chinese Patent Application No. 202080007665 (Year: 2024).*
(Continued)

*Primary Examiner* — Parviz Hassanzadeh
*Assistant Examiner* — Margaret Klunk
(74) *Attorney, Agent, or Firm* — Volpe Koenig (57) ABSTRACT

According to one aspect of the technique, there is provided a substrate processing apparatus including: a reaction chamber in which a substrate is processed; a lid configured to close a furnace opening of the reaction chamber; a base provided below the lid; and a connector provided to connect the lid and the base. The connector includes: a shaft provided at the lid; an elastic structure provided to surround the shaft and configured to hold the lid; a cap provided to surround the elastic structure and provided at the base; a fixing block provided below the cap; and a moving block held by a holder provided between the fixing block and the shaft.

16 Claims, 7 Drawing Sheets (56) References Cited

U.S. PATENT DOCUMENTS

| | | | |
|---|---|---|---|
| 6,932,885 B1* | 8/2005 | Oka ..................... | B01J 19/285 |
| | | | 156/345.55 |
| 2007/0264582 A1* | 11/2007 | Chang ..................... | G03F 1/48 |
| | | | 430/5 |
| 2015/0211796 A1* | 7/2015 | Kikuchi .............. | F27B 17/0025 |
| | | | 432/250 |
| 2017/0162424 A1* | 6/2017 | Umise ............... | H01L 21/68742 |
| 2017/0352566 A1* | 12/2017 | Ramaswamy .... | H01J 37/32706 |
| 2019/0252218 A1* | 8/2019 | Ueda ................ | H01L 21/67126 |

FOREIGN PATENT DOCUMENTS

| | | |
|---|---|---|
| JP | 2003-309078 A | 10/2003 |
| KR | 20030031252 A | 4/2003 |

OTHER PUBLICATIONS

Korean Office Action issued on Dec. 13, 2022 for Korean Patent Application No. 10-2021-7020927.
Japanese Office Action issued on Jul. 5, 2022 for Japanese Patent Application No. 2021-502064.

* cited by examiner

SUBSTRATE PROCESSING APPARATUS AND FURNACE OPENING CLOSER

CROSS-REFERENCE TO RELATED PATENT APPLICATION

This non-provisional U.S. patent application claims priority under 35 U.S.C. § 119 of International Application No. PCT/JP2020/006416, filed on Feb. 19, 2020, in the WIPO, and Japanese Patent Application No. 2019-028224, filed on Feb. 20, 2019, in the Japanese Patent Office, the entire contents of which are hereby incorporated by reference.

1. FIELD

The present disclosure relates to a substrate processing apparatus configured to process a substrate such as a semiconductor wafer, and a furnace opening closer.

2. DESCRIPTION OF THE RELATED ART

In a manufacturing process of a semiconductor device, a vertical type substrate processing apparatus may be used as a substrate processing apparatus capable of performing a substrate processing. According to the conventional vertical type substrate processing apparatus, an arm provided in a moving mechanism (also referred to as a "moving structure") may be bent due to a weight of a substrate retainer, a thrust of the moving mechanism or the like when a reaction chamber is airtightly closed. Conventionally, the vertical type substrate processing apparatus is provided with a mechanism (also referred to as a "structure") capable of maintaining an airtightness of an inside of the reaction chamber even when the arm is bent to break a parallelism among an opening of the reaction chamber, the arm and a base.

For example, according to some related arts, there is disclosed a configuration capable of maintaining the airtightness of the inside of the reaction chamber by holding a lid by a plurality of elastic mechanisms (also referred to as "elastic structures") arranged on the base even when the parallelism among the opening of the reaction chamber, the arm and the base is broken.

However, a conventional positioning mechanism is configured such that the base is slid up and down with respect to a cylinder provided in a center portion of the lid, which may not be able to cope with a position change due to a thermal expansion. As a result, there is a risk that particles are generated by the friction between mechanisms when the base is slid up and down in a closing operation.

SUMMARY

Described herein is a technique capable of accurately positioning a lid when closing a furnace opening while suppressing the generation of particles from a positioning structure.

According to one aspect of the technique of the present disclosure, there is provided a substrate processing apparatus including: a reaction chamber in which a substrate is processed; a lid configured to close a furnace opening of the reaction chamber; a base provided below the lid; and a connector provided to connect the lid and the base, wherein the connector includes: a shaft provided at the lid; an elastic structure provided to surround the shaft and configured to hold the lid; a cap provided to surround the elastic structure and provided at the base; a fixing block provided below the cap; and a moving block held by a holder provided between the fixing block and the shaft.

DETAILED DESCRIPTION

<Embodiments>

Figure 1:
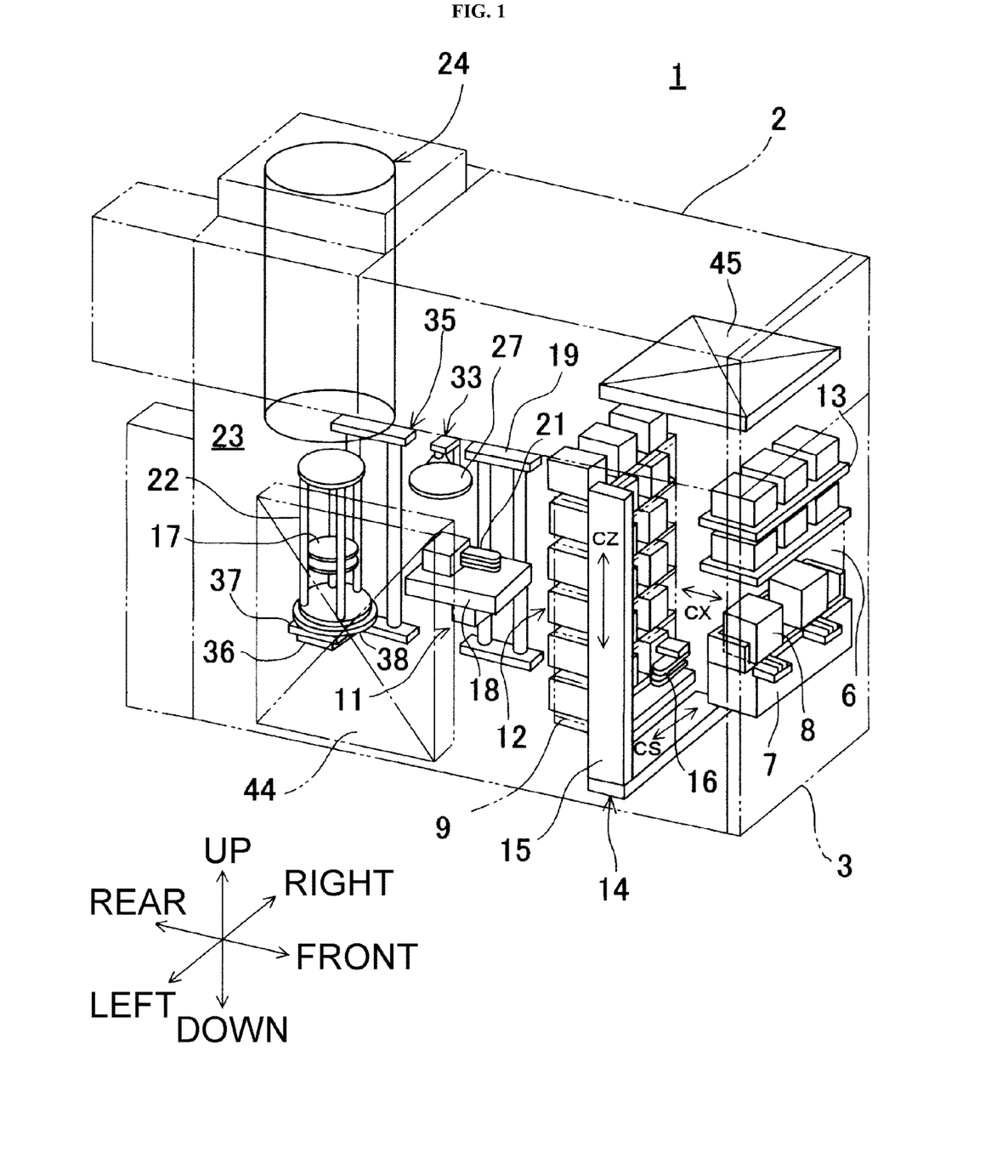
FIG. 1 is a diagram schematically illustrating a perspective view of a substrate processing apparatus according to one or more embodiments described herein.
Figure 2:
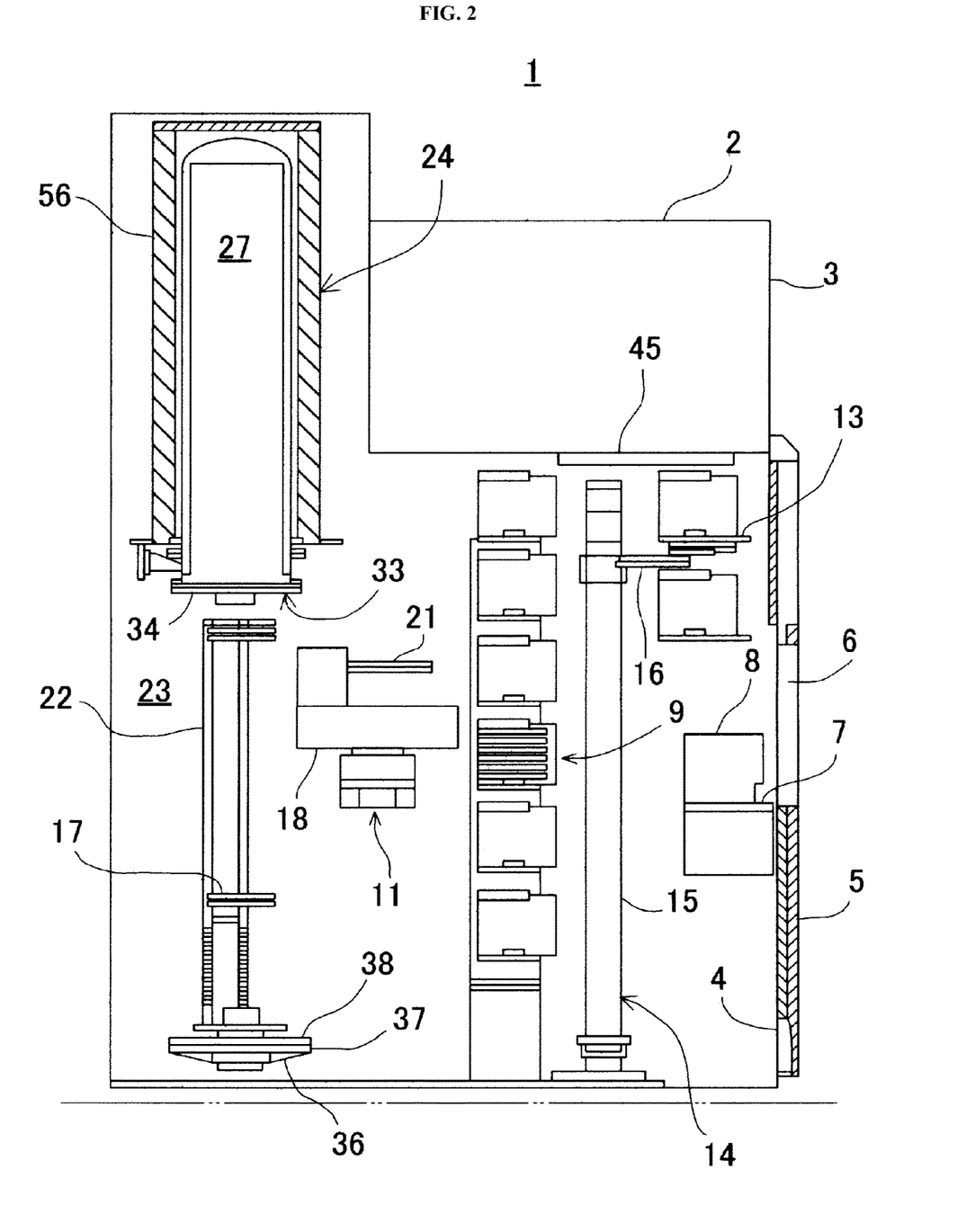
FIG. 2 is a diagram schematically illustrating a vertical cross-section of a process furnace of the substrate processing apparatus according to the embodiments described herein.
Figure 3:
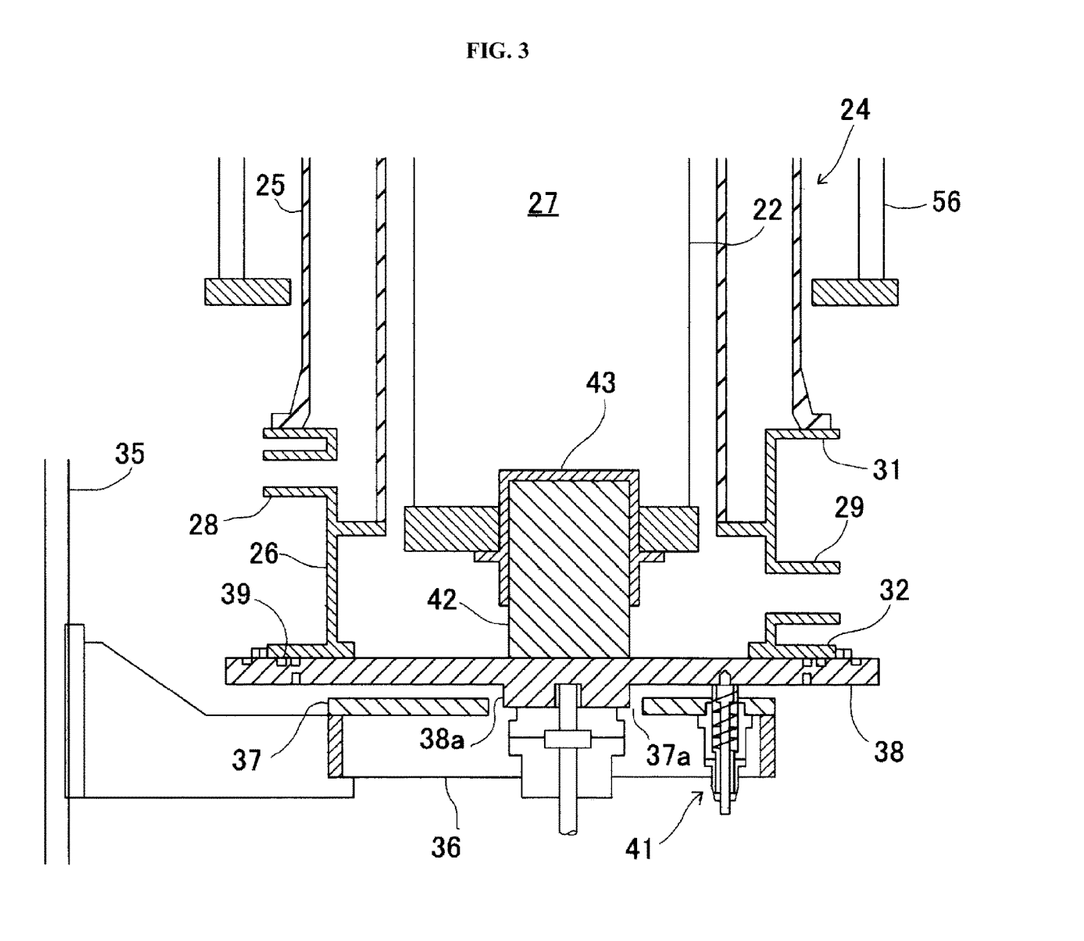
FIG. 3 is a diagram schematically illustrating an enlarged view of a main configuration of a furnace opening of the substrate processing apparatus according to the embodiments described herein.

Hereinafter, one or more embodiments (also simply referred to as "embodiments") according to the technique of the present disclosure will be described with reference to the drawings. FIGS. 1 through 3 are diagrams schematically illustrating a vertical type substrate processing apparatus serving as an example of a substrate processing apparatus. As an example of a substrate processed by the substrate processing apparatus, a wafer 17 made of a material such as silicon is illustrated.

A substrate processing apparatus 1 includes a housing 2. A front maintenance port 4 serving as an opening provided for maintenance is provided at a lower portion of a front wall 3 of the housing 2. The front maintenance port 4 is opened and closed by a front maintenance door 5.

A pod loading/unloading port 6 is provided at the front wall 3 of the housing 2 so as to communicate with an inside and an outside of the housing 2. The pod loading/unloading port 6 may be opened or closed by a front shutter (not shown). A loading port (which is a loading port shelf) 7 is provided at the pod loading/unloading port 6. The loading port 7 is configured such that a pod 8 is aligned while placed on the loading port 7.

The pod 8 is a sealed type substrate container. The pod 8 may be transferred into and placed on the loading port 7 by an in-process transfer apparatus (not shown) and transferred from the loading port 7 by the in-process transfer apparatus.

A pod shelf 9 is provided at a substantially center portion in a front-rear direction in the housing 2. The pod shelf 9 is configured to store a plurality of pods including the pod 8 in a plurality of stages and a plurality of rows. A transfer shelf 12 configured to accommodate the pod 8 to be transferred by a wafer transfer structure (hereinafter, also referred to as a "transfer device") 11 is provided at the pod shelf 9. A spare pod shelf 13 is provided above the loading port 7, and is configured to store the pod 8 in reserve.

A pod transfer device 14 is provided between the loading port 7 and the pod shelf 9. The pod transfer device 14 may be constituted by: a pod elevator 15 capable of elevating and lowering the pod 8 in a CZ axis direction shown in FIG. 1 while holding (or supporting) the pod 8; and a pod transfer structure 16 capable of making forward, backward and rotational movements of the pod 8 in a CX axis direction and a CS axis direction shown in FIG. 1. In cooperation with the pod elevator 15 and the pod transfer structure 16, the pod transfer device 14 is configured such that the pod 8 can be transferred among the loading port 7, the pod shelf 9 and the spare pod shelf 13.

The transfer device 11 is provided behind the pod shelf 9. For example, the transfer device 11 is constituted by: a wafer transfer device 18 capable of rotating or moving the wafer 17 horizontally; and a wafer transfer device elevator 19 capable of elevating and lowering the wafer transfer device 18.

The wafer transfer device 18 may include a predetermined number of wafer mounting plates (which are substrate supports) 21 on which a predetermined number of wafers including the wafer 17 are mounted. For example, as shown in FIG. 1, three wafers can be mounted on three wafer mounting plates 21. In cooperation with the wafer transfer device 18 and the wafer transfer device elevator 19, the transfer device 11 is configured to load the wafer 17 into a boat (which is a substrate retainer) 22 and to unload the wafer 17 out of the boat 22. Further, a notch alignment device (not shown) serving as a substrate alignment device configured to align a circumferential position of the wafer 17 may be provided in the vicinity of the transfer device 11.

In a rear region of the housing 2, a standby space 23 where the boat 22 is accommodated and in standby is provided, and a vertical type process furnace 24 is provided above the standby space 23. The process furnace 24 may be constituted by: a reaction tube 25 in which the wafer 17 is processed; and an inlet flange 26 provided at a lower end of the reaction tube 25. For example, the inlet flange 26 is made of stainless steel. A reaction chamber 27 is defined inside the process furnace 24. The inlet flange 26 is of a cylindrical shape. A supply port 28 through which various process gases are supplied into the reaction chamber 27 and an exhaust port 29 through which an inner atmosphere of the reaction chamber 27 is exhausted are provided on a peripheral surface of the inlet flange 26. Further, an upper flange 31 and a lower flange 32 are provided at an upper end and a lower end of the inlet flange 26, respectively, and an opening (also referred to as a "furnace opening") is provided at a lower end portion of the lower flange 32.

The furnace opening is opened and closed by a furnace opening shutter (lid opening/closing structure) 33. The furnace opening shutter 33 includes a lid 34. The furnace opening shutter 33 is configured to open or close the furnace opening by moving the lid 34 between a standby position and a furnace opening position. In the standby position, the lid 34 is retracted to a position where the lid 34 does not come into contact with other components such as the boat 22, and in the furnace opening position, the lid 34 is configured to airtightly close the furnace opening.

A boat elevator 35 configured to elevate the boat 22 into the reaction chamber 27 or lower the boat 22 from the reaction chamber 27 is provided in the standby space 23. As shown in FIG. 3, a base 37 is horizontally provided on a furnace side arm 36 connected to an elevating table of the boat elevator 35. A hole 37a notched in a circular shape is provided at a center portion of the base 37. A moving structure configured to insert the boat 22 into the reaction chamber 27 and to pull out the boat 22 from the reaction chamber 27 is constituted by the boat elevator 35, the furnace side arm 36 and the base 37.

A seal cap 38 serving as a lid is horizontally provided on the base 37. A column 38a of a cylindrical shape extending downward is provided on a lower surface of the seal cap 38. An outer diameter of the column 38a is smaller than an inner diameter of the hole 37a, and the column 38a is concentrically inserted into the hole 37a at a predetermined gap therebetween. The gap between the column 38a and the hole 37a is set such that the column 38a does not come into contact with the base 37 when the seal cap 38 is tilted with respect to the base 37.

Further, an O-ring 39 is provided on the seal cap 38, and the reaction chamber 27 can be airtightly closed via the O-ring 39. The base 37 and the seal cap 38 are connected via a plurality of furnace opening closers (hereinafter, also referred to as connectors) 41 provided in a circumferential direction described later. However, one furnace opening closer among the plurality of furnace opening closers 41 is shown in FIG. 3. Hereinafter, one of the furnace opening closers (or the connectors) 41 may also be referred to as a furnace opening closer 41 (or a connector 41).

A connecting rod 42 is provided at the seal cap 38 perpendicular to the seal cap 38. A cap receiver 43 covers an upper end of the connecting rod 42. The cap receiver 43 is configured to hold the boat 22 parallel to the seal cap 38. According to the present embodiments, the cap receiver 43 is provided on the connecting rod 42. However, the cap receiver 43 may be provided on a rotating shaft of a boat rotator configured to rotate the boat 22 such that the boat 22 and the cap receiver 43 are rotated as a single body.

The boat 22 is configured such that a plurality of wafers (for example, 50 to 175 wafers) including the wafer 17 are supported on the boat 22 in a horizontal orientation in a multistage manner with their centers aligned with one another.

A clean air supply structure (which is a clean air supplier) 44 is arranged at a position facing the boat elevator 35. The clean air supply structure 44 is constituted by a supply fan and a dustproof filter so as to supply clean air such as an inert gas and a clean atmosphere.

The clean air ejected from the clean air supply structure 44 is circulated in components such as the transfer device 11 and the boat 22. Thereafter, the clean air is exhausted out of the housing 2 through a duct 45 provided above the pod shelf 9, or is ejected again into the housing 2 by the clean air supply structure 44.

Figure 4A:
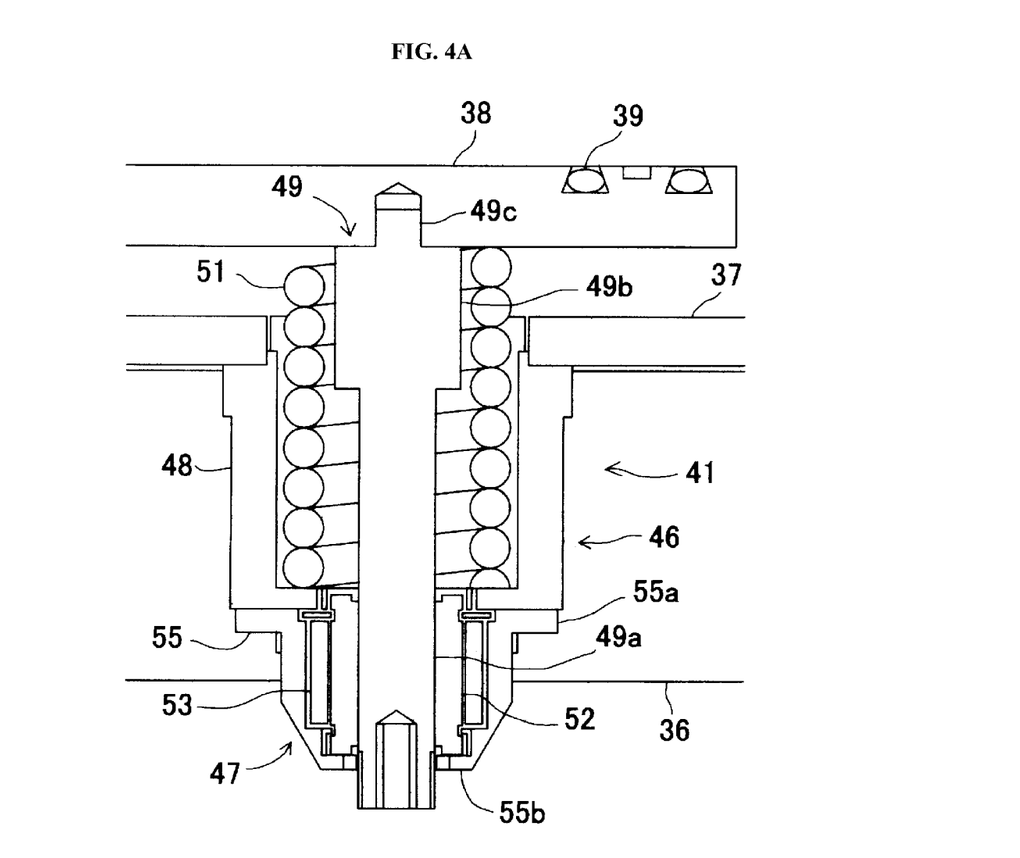
FIG. 4A is a diagram schematically illustrating a cross-section of an example of a connector applied at the furnace opening of the substrate processing apparatus according to the embodiments described herein.
Figure 4B:
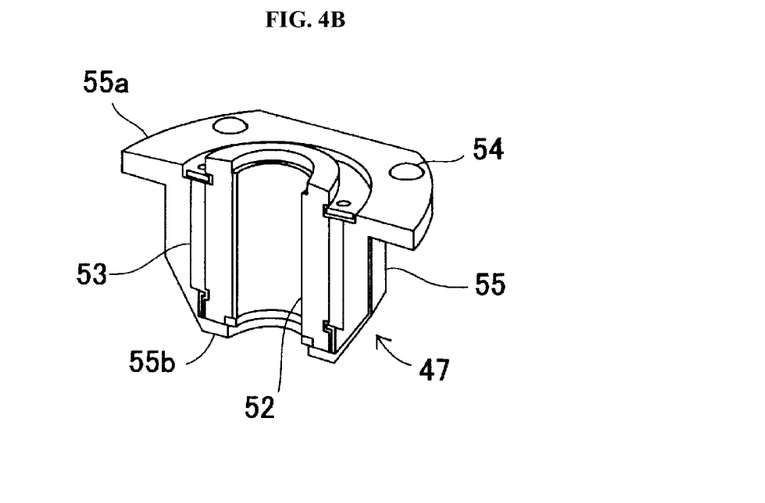
FIG. 4B is a diagram schematically illustrating a cross-section of an example of a positioning structure of the connector applied at the furnace opening of the substrate processing apparatus according to the embodiments described herein.

Subsequently, the connector 41 according to the present embodiments described herein will be described in detail with reference to FIGS. 4A and 4B.

The connector 41 is constituted by a closing structure 46 and a positioning structure 47. The closing structure 46 may include: a spring cap 48 serving as a cap of a cylindrical shape; a linear shaft 49 serving as a shaft penetrating an inside of the spring cap 48; and an elastic structure (for example, a spring 51) surrounding the linear shaft 49 and fitted in the spring cap 48.

An upper end of the spring cap 48 is open, and a flange extending toward a center of the spring cap 48 is provided at a lower end of the spring cap 48. That is, a hole smaller than a diameter of the spring 51 and greater than a diameter of a small diameter portion 49a of the linear shaft 49 is provided at the lower end of the spring cap 48. Further, a hole through which the linear shaft 49 and the spring 51 can be inserted is provided at the base 37, and the spring cap 48 is fixed to an edge of the hole provided at the base 37 from thereunder.

The linear shaft 49 may include: a large diameter portion 49b provided at an upper end portion thereof; the small diameter portion 49a extending downward from a lower surface of the large diameter portion 49b; and a screw portion 49c protruding upward from an upper surface of the large diameter portion 49b. The linear shaft 49 is adapted so that the linear shaft 49 can be fixed to the lower surface of the seal cap 38 via the screw portion 49c.

When the spring cap 48 is fixed to the base 37 and the linear shaft 49 is fixed to the seal cap 38, the spring 51 comes into contact with the flange at the lower end of the spring cap 48 and the lower surface of the seal cap 38 such that the seal cap 38 is pressed upward with respect to the base 37. Due to a pressing force of the spring 51, the seal cap 38 is held at a predetermined distance from the base 37.

Further, the positioning structure 47 may include: a moving block 52 of a cylindrical shape configured to slidably hold the linear shaft 49 in an axial direction of the linear shaft 49; a holder (which is a holding structure) 53 configured to hold the moving block 52; and a fixing housing 55 serving as a fixing block screwed to the spring cap 48 via holes 54 and configured to hold the holder 53.

The moving block 52 is configured such that the linear shaft 49 (the small diameter portion 49a) can make a precisely linear movement by using a ball or a slipping. Further, for example, the moving block 52 may be further provided with a linear bush or a ball spline. On the other hand, the moving block 52 is configured such that a positional deviation of the linear shaft 49 in a radial direction is allowed about 5 μm to 10 μm. An inner diameter of the moving block 52 is set to be smaller than that of the large diameter portion 49b of the linear shaft 49.

The holder 53 is configured as a structure in which the moving block 52 is held (or supported) by an elastic material such as rubber formed in a cylindrical shape. Further, the holder 53 and the moving block 52 are provided inside the fixing housing 55, an outer flange 55a extending toward an outer periphery of the fixing housing 55 is provided at an upper end of the fixing housing 55, and an inner flange 55b extending toward a center of the fixing housing 55 is provided at a lower end of the fixing housing 55. The holes 54 are provided in predetermined positions (for example, four positions) of the outer flange 55a, and the fixing housing 55 can be screw-fixed to the spring cap 48 through the holes 54. An inner diameter of the inner flange 55b is set to be smaller than an outer diameter of the holder 53 and greater than an outer diameter of the small diameter portion 49a of the linear shaft 49.

When the positioning structure 47 is attached to the closing structure 46 and the closing structure 46 is attached to the base 37 and the seal cap 38, the seal cap 38 is positioned with respect to the base 37 so that the hole 37a and the column 38a are aligned concentric. Further, a radial displacement of the linear shaft 49, that is, a movement of the seal cap 38 in the circumferential direction with respect to the base 37 is regulated by the moving block 52.

When the seal cap 38 is displaced in the vertical direction, that is, in the axial direction of the linear shaft 49, the linear shaft 49 slides through the moving block 52 while bending the spring 51.

Even when the seal cap 38 is displaced in the circumferential direction, that is, in the radial direction of the linear shaft 49, the moving block 52 is held by the holder 53. Therefore, a displacement of the moving block 52 due to a displacement of the linear shaft 49 is absorbed by an elastic force of the holder 53. As a result, the connector 41 according to the present embodiments can allow the linear shaft 49 to be displaced by about several millimeters in the radial direction.

An elastic structure involving the elastic force may be used as the holder 53. However, other structure flexible enough to absorb the displacement of the moving block 52 may also be used as the holder 53. For example, as shown in FIGS. 5A and 5B, an O-ring may be used as the holder 53.

Even when the O-ring is used as the holder 53, the displacement of the moving block 52 can be absorbed by an elastic deformation of the O-ring. As a result, the connector 41 according to the present embodiments can allow the linear shaft 49 to be displaced by about several millimeters in the radial direction.

Figure 5A:
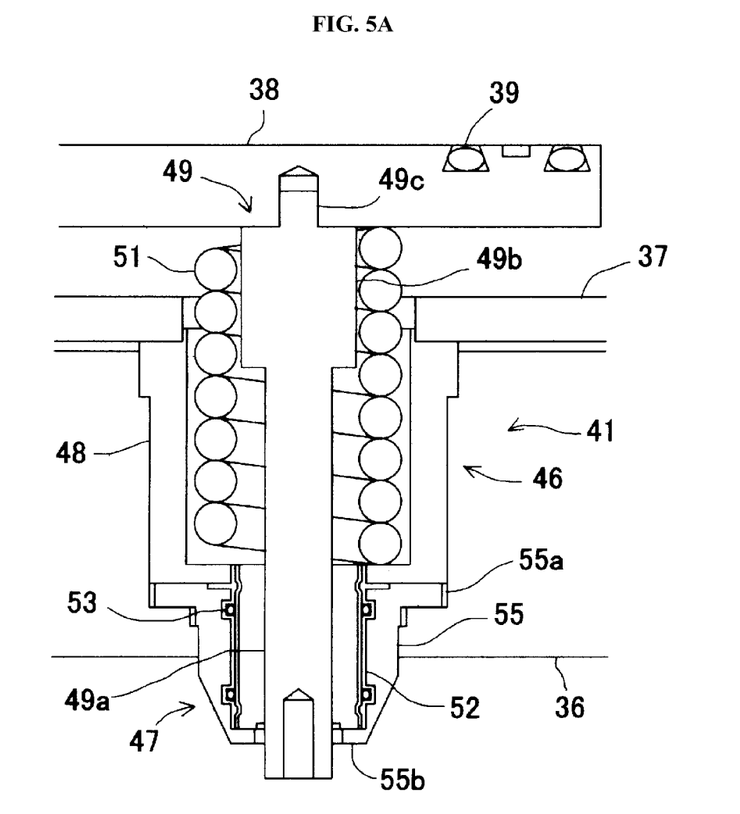
FIG. 5A is a diagram schematically illustrating a cross-section of another example of the connector applied at the furnace opening of the substrate processing apparatus according to the embodiments described herein.
Figure 5B:
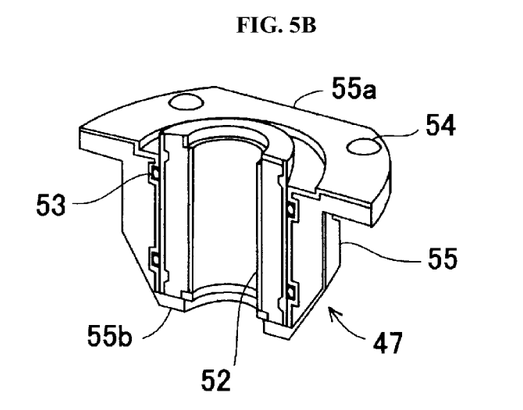
FIG. 5B is a diagram schematically illustrating a cross-section of another example of the positioning structure of the connector applied at the furnace opening of the substrate processing apparatus according to the embodiments described herein.

In FIGS. 5A and 5B, the moving block 52 is held at two locations (that is, upper and lower locations) by the O-ring. However, the moving block 52 may be held at three or more locations.

Subsequently, an operation of the substrate processing apparatus 1 will be described.

When the pod loading/unloading port 6 is opened by the front shutter (not shown), the pod 8 is transferred (loaded) into the housing 2 through the pod loading/unloading port 6 and placed on the loading port 7. When the pod 8 is placed on the loading port 7, the pod loading/unloading port 6 is closed by the front shutter.

The pod 8 on the loading port 7 is placed at a designated shelf position of the pod shelf 9 or the spare pod shelf 13 by the pod transfer device 14. The pod 8 is temporarily stored in the pod shelf 9 or the spare pod shelf 13. Then, the pod 8 is transferred to the transfer shelf 12 by the pod transfer device 14, or transferred directly from the loading port 7 to the transfer shelf 12. When the pod 8 is transferred, the clean air is circulated such that the housing 2 is filled with the clean air.

When the pod 8 is transferred to the transfer shelf 12, the wafer 17 is transferred out of the pod 8 by the wafer transfer structure 11 and transferred to the notch alignment device (not shown). After aligning the position of the wafer 17 by the notch alignment device, the wafer transfer structure 11 transfers the wafer 17 into the standby space 23 and loads (charges) the wafer 17 into the boat 22.

After loading the wafer 17 into the boat 22, the wafer transfer structure 11 then returns to the pod 8 and transfers a next wafer among a plurality of wafers stored in the pod 8 into the boat 22.

When a predetermined number of wafers including the wafer 17 are charged into the boat 22, the furnace opening of the process furnace 24 closed by the furnace opening shutter 33 is opened by moving the furnace opening shutter 33 to the standby position. Subsequently, the boat 22 is elevated by the boat elevator 35 until the boat 22 is loaded into the reaction chamber 27.

After the boat 22 is loaded, the furnace opening is airtightly closed by the seal cap 38, and a predetermined substrate processing is performed on the wafer 17.

The reaction chamber 27 is vacuum-exhausted by a gas exhaust structure (which is a gas exhauster) (not shown) through the exhaust port 29 such that an inner pressure of the reaction chamber 27 reaches and is maintained at a desired pressure (vacuum degree). Further, the reaction chamber 27 is heated to a predetermined temperature by a heating structure (also referred to as a "heater") 56 such that a desired temperature distribution of the reaction chamber 27 is obtained.

A process gas whose flow rate is controlled to a predetermined flow rate is supplied through the supply port 28 by a gas supply structure (which is a gas supplier) (not shown), and the process gas comes into contact with a surface of the wafer 17 while flowing through the reaction chamber 27. When the process gas comes into contact with the surface of the wafer 17, a film is formed on the surface of the wafer 17 by a thermal CVD (chemical vapor deposition) reaction. Further, the processed gas after the reaction is exhausted from the reaction chamber 27 by the gas exhaust structure.

After a predetermined process time has elapsed, the inert gas is supplied from an inert gas supply source (not shown) by the gas supply structure, the inner atmosphere of the reaction chamber 27 is replaced with the inert gas, and the inner pressure of the reaction chamber 27 is returned to the normal pressure.

The boat 22 is lowered by the boat elevator 35 through the seal cap 38. Further, the furnace opening shutter 33 is moved to the furnace opening position to close the furnace opening of the process furnace 24.

After the wafer 17 is processed, the wafer 17 and the pod 8 are transferred (unloaded) out of the housing 2 in the order reverse to that of loading the wafer 17 and the pod 8 into the housing 2 described above. Then, an unprocessed wafer 17 is further loaded into the boat 22, and a batch processing of the wafer 17 is repeatedly performed.

Figure 6:
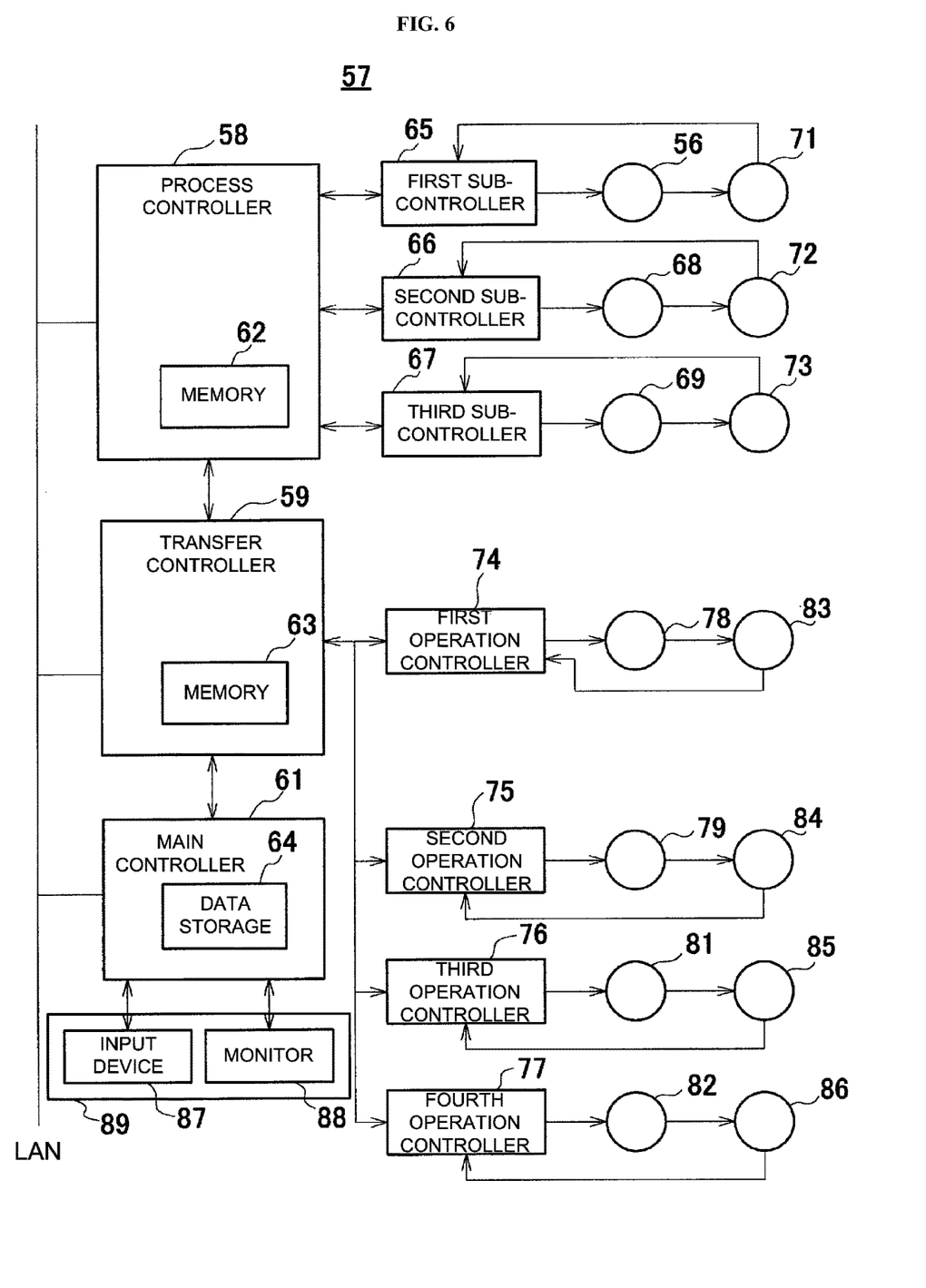
FIG. 6 is a block diagram schematically illustrating a control system of the substrate processing apparatus according to the embodiments described herein.

The transfer structure configured to transfer the pod 8 accommodating the wafers including the wafer 17 among the loading port 7, the pod shelf 9, the spare pod shelf 13 and the transfer shelf 12, the transfer structure configured to transfer the wafer 17 in the pod 8 to the boat 22 and to transfer the boat 22 to the process furnace 24, a driving structure configured to open and close the furnace opening shutter 33, the gas supply structure configured to supply a gas such as the process gas to the process furnace 24, the gas exhaust structure configured to exhaust an inner atmosphere of the process furnace 24, the heater 56 configured to heat the process furnace 24 to a predetermined temperature and a control system 57 configured to control each of the transfer structures, the driving structure, the gas supply structure, the gas exhaust structure and the heater 56 will be described with reference to FIG. 6. A substrate processing structure is constituted by the gas supply structure, the gas exhaust structure, the process furnace 24 and the heater 56.

In FIG. 6, a reference numeral 58 denotes a process controller serving as a process system controller, a reference numeral 59 denotes a transfer controller serving as a transfer system controller, and a reference numeral 61 denotes a main controller. The process controller 58 includes a memory 62, and a process execution program for executing a process is stored in the memory 62. The transfer controller 59 includes a memory 63. A transfer program for executing a transfer process of the wafer 17 and an operation control program for controlling operations of three transfer structures of the pod transfer device 14, the wafer transfer structure 11 and the boat elevator 35 and the furnace opening shutter 33 are stored in the memory 63. The main controller 61 includes a data storage 64, and the data storage 64 is constituted by an external memory such as an HDD (hard disk drive), for example. The process execution program, the transfer program and the operation control program may be stored in the data storage 64.

Sub-controllers 65, 66 and 67 are exemplified in FIG. 6. For example, a reference numeral 65 denotes a first sub-controller configured to control the heating of the process furnace 24, a reference numeral 66 denotes a second sub-controller configured to control operations such as an opening/closing operation of a valve and an operation of a flow rate controller such that a supply flow rate of the process gas to the process furnace 24 can be controlled, and a reference numeral 67 denotes a third sub-controller configured to control the exhaust of the gas from the process furnace 24 or configured to control a pressure of the process furnace 24. Similarly, actuators 56, 68 and 69 are exemplified. For example, a reference numeral 56 denoted the heater controlled by the first sub-controller 65 (hereinafter, also referred to as a "first process actuator"), a reference numeral 68 denotes the flow rate controller controlled by the second sub-controller 66 (hereinafter, also referred to as a "second process actuator"), and a reference numeral 69 denotes a pressure control valve (hereinafter, also referred to as a "third process actuator") controlled by the third sub-controller 67. Although one process actuator is shown for each sub-controller in FIG. 6, a plurality of process actuators may be provided.

Reference numerals 71, 72 and 73 denote sensors configured to detect a state of each process actuator and configured to feed back the detected results to the first sub-controller 65, the second sub-controller 66 and the third sub-controller 67, respectively. For example, the reference numeral 71 denotes a temperature detector (hereinafter, also referred to as a "first process sensor"), the reference numeral 72 denotes a flow rate detector (hereinafter, also referred to as a "second process sensor") and the reference numeral 73 denotes a pressure sensor (hereinafter, also referred to as a "third process sensor"). Although one detector or sensor for detecting the state of each process actuator is shown for each process actuator in FIG. 6, a plurality of detectors and sensors may be provided.

The transfer controller 59 controls various transfer control modules, and the various transfer control modules may be constituted by a first operation controller 74, a second operation controller 75, a third operation controller 76 and a fourth operation controller 77, which are configured to control operation actuators described later.

The first operation controller 74 serving as a driver is configured to control a servomotor (hereinafter, also referred to as a "first operation actuator") 78 serving as a driver configured to drive the pod transfer device 14. The second operation controller 75 serving as a driver is configured to control a servomotor (hereinafter, also referred to as a "second operation actuator") 79 serving as a driver configured to make forward, backward, upward, downward and rotational movements of the transfer device 11. The third operation controller 76 serving as a driver is configured to control a servomotor (hereinafter, also referred to as a "third operation actuator") 81 serving as a driver configured to drive the boat elevator 35. The fourth operation controller 77 serving as a driver is configured to control an electromagnetic switching valve (hereinafter, also referred to as a "fourth operation actuator") 82 serving as a driver configured to drive the lid 34 of the furnace opening shutter 33.

State detection sensors 83, 84, 85 and 86 configured to detect a state of each operation actuator (for example, a position state such as whether or not each operation actuator is at a limit point) are provided at each operation actuator. The state detection sensor 83, 84, 85 and 86 are configured to detect the state of each operation actuator, and configured to feed back the detected results to the first operation controller 74, the second operation controller 75, the third operation controller 76 and the fourth operation controller 77, respectively. Each of the operation controllers 74, 75, 76 and 77 includes a memory capable of temporarily storing the fed-back data (detected results). Although the state detection sensors 83, 84, 85 and 86 is shown for the operation actuators 78, 79, 81 and 82 in FIG. 6, respectively, the present embodiments are not limited to thereto. Needless to say, a plurality of state detection sensors may be provided at each operation actuator.

The first operation controller 74 drives and controls the pod transfer device 14 configured to transfer the pod 8 from the loading port 7 to components such as the transfer shelf 12. The second operation controller 75 drives and controls the transfer device 11 configured to transfer the wafer 17 out of the pod 8 and configured to charge the wafer 17 into the boat 22. The third operation controller 76 drives and controls the boat elevator 35 configured to load the boat 22 charged with the wafer 17 into the process furnace 24. The fourth operation controller 77 drives and controls the furnace opening shutter 33 configured to open and close the furnace opening of the process furnace 24.

An input device 87 includes components such as a keyboard, a mouse and an operation panel. A monitor 88 represents an operation screen including a screen such as a setting screen. An operation device 89 is configured to receive various instructions from the monitor 88 by using the input device 87. For example, the monitor 88 is configured to individually set for a transfer operation in which the transfer device 11 is directed toward at least one among the pod 8 and the boat 22 and a transfer operation in which the transfer device 11 is away from at least one among the pod 8 and the boat 22.

An instruction of a set value or a command signal according to a process sequence is input to the first sub-controller 65, the second sub-controller 66 and the third sub-controller 67 from the process controller 58. The process controller 58 is configured to collectively control the first sub-controller 65, the second sub-controller 66 and the third sub-controller 67 based on the detected results detected by the temperature detector 71, the flow rate detector 72 and the pressure sensor 73.

The process controller 58 is configured to perform a substrate processing in response to a command from the operation device 89 via the main controller 61. The substrate processing is performed independently of other control systems by the process controller 58 according to the program stored in the memory 62. Therefore, even when a problem occurs in the transfer controller 59 and the main controller 61, the substrate processing is completed without interruption.

The first operation controller 74 is configured to control the first operation actuator 78 based on the detected results detected by the state detection sensor 83. The second operation controller 75 is configured to control the second operation actuator 79 based on the detected results detected by the state detection sensor 84. The third operation controller 76 is configured to control the third operation actuator 81 based on the detected results detected by the state detection sensor 85. Further, the fourth operation controller 77 is configured to control the fourth operation actuator 82 based on the detected results detected by the state detection sensor 86. That is, each operation controller is configured to control each operation actuator corresponding to each state detection sensor.

The transfer controller 59 is configured to perform the transfer process according to an instruction from the operation device 89. The pod 8 or the wafer 17 is transferred independently of other control systems according to the transfer program and the operation control program stored in the memory 63 by the transfer controller 59.

In the data storage 64, various programs such as a program for controlling the progress of the substrate processing, a setting program for setting process contents and process conditions, a recipe for the substrate processing in which setting conditions such as the heating of the process furnace 24 and the supply and exhaust of the process gas, a communication program, an alarm information display program and a parameter editing program are stored as files.

The communication program is configured to transmit or receive data to or from the process controller 58 and the transfer controller 59 via a communication means such as a LAN. Further, when an abnormality is detected by the state detection sensor 83, 84, 85 or 86, the alarm information display program is configured to display on the monitor 88 the cause of the abnormality of the operation actuator 78, 79, 81 or 82, for example, the alarm information representing the cause of the stop of the operation actuator 78, 79, 81 or 82.

The data storage 64 includes a data storage area. In the data storage area, parameters for transferring the wafer 17 are stored. Information such as setting information preset in the transfer structures, the detected results detected by the state detection sensors 83, 84, 85 and 86 and processing states may be further stored in the data storage area.

Figure 7:
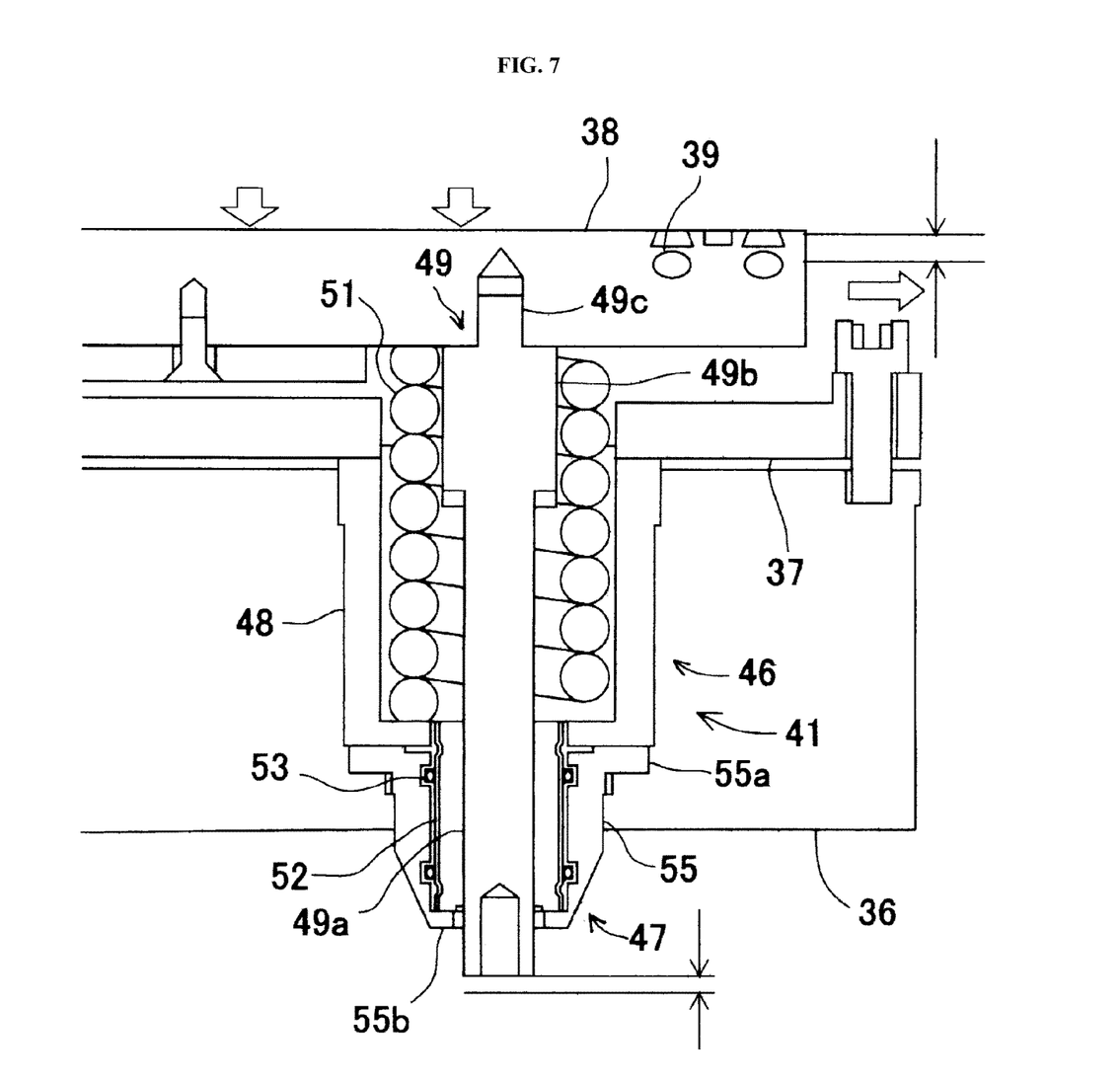
FIG. 7 is an explanatory diagram schematically illustrating a displacement of a lid with respect to a base of the connector applied at the furnace opening of the substrate processing apparatus according to the embodiments described herein.

As shown in FIG. 7, in the transfer process of the wafer 17, when the boat 22 is inserted into the reaction chamber 27 and the furnace opening is closed by the seal cap 38, the furnace side arm 36 may be bent by components such as the boat 22, the wafer 17, the seal cap 38 and the base 37 or by a thrust of the boat elevator 35. As a result, the furnace side arm 36 may be tilted downward.

Further, in a film-forming process of the wafer 17, when the reaction chamber 27 is heated by the heater 56, a temperature of the seal cap 38 is elevated to about the same level as an inner temperature of the reaction chamber 27, that is, to about 200° C. at the maximum. On the other hand, a temperature of the base 37 remains about the same as the room temperature. Therefore, as shown in FIG. 7, a temperature difference occurs between the base 37 and the seal cap 38, and the seal cap 38 expands due to the heat load (a right direction in FIG. 7) without undergoing an expansion of the base 37.

According to the present embodiments, the seal cap 38 is supported by the base 37 by the connectors 41 including the spring 51 serving as the elastic structure and the moving block 52 of the positioning structure 47 is held by the holder 53 serving as a flexible elastic structure. Therefore, it is possible to absorb the displacement generated in the connectors 41 by the elasticity of the holder 53.

Further, since the seal cap 38 is pressed upward with respect to the base 37 by the spring 51, even when a parallelism between the furnace side arm 36 and the base 37 is broken due to the bending, the seal cap 38 can come into contact with the lower flange 32 such that an airtightness of the reaction chamber 27 can be maintained. In addition, the tilt of the linear shaft 49 or the moving block 52 due to the tilt of the base 37 can be absorbed by the elasticity of the holder 53, and the positioning structure 47 can be prevented from being damaged.

Further, even when the linear shaft 49 of the connector 41 or the moving block 52 is misaligned in an axis direction due to the thermal expansion of the seal cap 38 and displaced in the circumferential direction or the radial direction, the displacement of the thermal expansion can be absorbed by the elasticity of the holder 53, and the positioning structure 47 can be prevented from being damaged.

Further, by allowing the positional deviation of about several millimeters by the elastic deformation of the holder 53, the connector 41 can be prevented from being damaged due to the bending or the thermal expansion. Therefore, it is possible for the spring cap 48 to dispense with such structure as an elongated hole configured to allow the linear shaft 49 to be displaced according to the bending or the thermal expansion. Therefore, the sliding does not occur between the spring cap 48 and the linear shaft 49 when the seal cap 38 is opened or closed or thermally expands, and it is possible to suppress the generation of particles.

Further, since the connector 41 allows the positional deviation of about several millimeters, even when a rotating driver configured to rotate the cap receiver 43 or the connecting rod 42 is provided, it is possible to omit a large positioning structure 47 including a linear shaft 49 whose diameter is about 150 mm. Therefore, since a small positioning structure 47 can be used as the positioning structure 47, it is possible to reduce the manufacturing cost.

Further, since the spring cap 48 is fixed to the base 37 and the linear shaft 49 is fixed to the seal cap 38, the base 37 and the seal cap 38 are connected with each other via the connector 41, so that the seal cap 38 can be positioned with respect to the base 37 in the radial direction, the circumferential direction, and the axial direction. Further, since the connector 41 regulates the movement of the seal cap 38 with respect to the base 37, it is possible to suppress the rotation of the seal cap 38.

Therefore, it is possible to omit an operation of sliding the base 37 along the column 38a in order to position the seal cap 38 in the axial direction with respect to the base 37, and it is possible to suppress the generation of the particles due to the sliding.

Further, the column 38a also thermally expands as the seal cap 38 thermally expands. However, according to the present embodiments, since it is possible to omit the operation of sliding the base 37 along the column 38a in order to position the seal cap 38, a positioning accuracy is not deteriorated even when a certain gap is provided between the column 38a and the hole 37a.

Further, since the predetermined gap is provided between the column 38a and the hole 37a, even when the furnace side arm 36 is bent and the seal cap 38 is tilted with respect to the base 37 or the seal cap 38 thermally expands, the column 38a does not come into contact with the base 37, and the generation of the particles can be suppressed. Further, it is possible to prevent the seizure and the like from occurring due to the partial wearing at contact portions between the linear shaft 49 and the moving block 52.

Other Embodiments

While the technique of the present disclosure is described in detail by way of the embodiments, the above-described technique is not limited thereto. The above-described technique may be modified in various ways without departing from the gist thereof. For example, the above-described technique may be applied not only to a semiconductor manufacturing apparatus but also to other substrate processing apparatuses such as an apparatus capable of processing a glass substrate such as an LCD (liquid crystal display) manufacturing apparatus. Further, a type of the film formed on the substrate according to the above-described technique is not particularly limited. For example, the above-described technique may be applied to processes of forming films of various types such as a nitride film such as a silicon nitride (SiN) film, an oxide film such as a silicon oxide (SiO) film and a metal oxide film.

As described above, according to some embodiments in the present disclosure, it is possible to accurately position the lid when closing the furnace opening and to suppress the generation of the particles from the positioning structure.

What is claimed is:

1. A substrate processing apparatus comprising:
    a reaction chamber in which a substrate is processed;
    a lid configured to close a furnace opening of the reaction chamber;
    a base provided below the lid; and
    a connector provided to connect the lid and the base,
    wherein the connector comprises:
        a shaft extending from the lid through the base;
        a cap fixed to the base and configured to fix a fixing block thereto below the cap; and
        a moving block provided within the fixing block, wherein the moving block is held by a holder having a hollow cylindrical shape and made of an elastic material, wherein the holder is interposed between the fixing block and the moving block such that an outer peripheral surface of the holder is surrounded by and in contact with an inner peripheral surface of the fixing block and an inner peripheral surface of the holder surrounds and is in contact with an outer peripheral surface of the moving block.

2. The substrate processing apparatus of claim 1, further comprising:
    a cap receiver provided parallel to the lid; and
    a substrate retainer in which the substrate is held,
    wherein the cap receiver is configured to be capable of holding the substrate retainer.

3. The substrate processing apparatus of claim 1, wherein an elastic structure is held by the cap, and the elastic structure is configured to be capable of pressing the lid upward.

4. The substrate processing apparatus of claim 1, wherein the moving block is configured to be capable of making a linear movement of the shaft.

5. The substrate processing apparatus of claim 4, wherein the moving block is further configured to be capable of positioning the base and the lid.

6. The substrate processing apparatus of claim 1, wherein the moving block is further configured to be capable of positioning the base and the lid.

7. The substrate processing apparatus of claim 1, wherein the holder is made of rubber or comprises an O-ring.

8. The substrate processing apparatus of claim 1, wherein the lid is configured to come into contact with a lower end of the reaction chamber such that an airtightness of the reaction chamber is maintained.

9. The substrate processing apparatus of claim 1, further comprising
    a substrate retainer in which the substrate is held, wherein the connector is configured to connect with the lid and the base, respectively, such that the substrate retainer is capable of being held parallel to the reaction chamber.

10. The substrate processing apparatus of claim 9, wherein the holder is configured to absorb a displacement of the connector due to a difference in thermal expansion between the lid and the base.

11. The substrate processing apparatus of claim 9, wherein the holder is configured to absorb a tilt of the shaft or the moving block due to a tilt of the base.

12. The substrate processing apparatus of claim 9, wherein the connector is configured to connect with the lid and the base, respectively, such that the substrate retainer is capable of being pulled out from the reaction chamber.

13. The substrate processing apparatus of claim 1, further comprising:
   a cap receiver provided parallel to the lid;
   a substrate retainer provided on the cap receiver to hold the substrate; and
   a rotator configured to rotate the substrate retainer,
   wherein the connector is configured to connect with the lid and the base, respectively, such that the substrate retainer on the cap receiver is rotatable.

14. The substrate processing apparatus of claim 1, wherein the moving block is provided with at least one of a linear bush or a ball spline that receives the shaft below the base.

15. A furnace opening closer provided to connect with a lid configured to close a furnace opening of a reaction chamber in which a substrate is processed and a base provided below the lid, respectively, the furnace opening closer comprising:
   a shaft extending from the lid through the base;
   a cap fixed to the base and configured to fix a fixing block thereto below the cap; and
   a moving block provided within the fixing block, wherein the moving block is held by a holder having a hollow cylindrical shape and made of an elastic material, wherein the holder is interposed between the fixing block and the moving block such that an outer peripheral surface of the holder is surrounded by and in contact with an inner peripheral surface of the fixing block and an inner peripheral surface of the holder surrounds and is in contact with an outer peripheral surface of the moving block.

16. The furnace opening closer of claim 15, wherein an elastic structure is held by the cap, and the elastic structure is configured to be capable of pressing the lid upward.

* * * * *